United States Patent
Harkness et al.

(10) Patent No.: US 9,965,574 B2
(45) Date of Patent: May 8, 2018

(54) CAD-BASED INITIAL SURFACE GEOMETRY CORRECTION

(71) Applicant: Dassault Systemes Simulia Corp., Providence, RI (US)

(72) Inventors: Harrington Hunter Harkness, Canton, MA (US); Dan Cojocaru, Providence, RI (US); Daniel Alexander Reece, Cincinnati, OH (US)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 721 days.

(21) Appl. No.: 14/138,706

(22) Filed: Dec. 23, 2013

(65) Prior Publication Data
US 2015/0178424 A1    Jun. 25, 2015

(51) Int. Cl.
G06F 17/50    (2006.01)

(52) U.S. Cl.
CPC ................................ *G06F 17/5018* (2013.01)

(58) Field of Classification Search
CPC .................................................. G06F 17/5018
USPC ............................................................. 703/1
See application file for complete search history.

(56) References Cited

U.S. PATENT DOCUMENTS

| | | | |
|---|---|---|---|
| 6,195,625 B1 * | 2/2001 | Day | G06F 17/5018 703/1 |
| 8,255,194 B2 | 8/2012 | Yu | |
| 2002/0120920 A1 * | 8/2002 | Jayaram | G06F 17/50 717/137 |
| 2003/0080957 A1 * | 5/2003 | Stewart | G06F 17/5018 345/420 |
| 2007/0179759 A1 * | 8/2007 | Mangon | G06F 17/5004 703/1 |
| 2009/0024370 A1 * | 1/2009 | Scott | G06F 17/5095 703/2 |
| 2012/0095738 A1 * | 4/2012 | Saito | G06F 17/5018 703/2 |

FOREIGN PATENT DOCUMENTS

WO    WO 2006/003438 A2    1/2006

OTHER PUBLICATIONS

Wikipedia, "Isogeometric Analysis," http://en.wikipedia.org/wiki/Isogeometric_analysis, Sep. 2009 (retrieved from Internet on Jan. 14, 2014), 2 pages.

(Continued)

*Primary Examiner* — Dwin M Craig
(74) *Attorney, Agent, or Firm* — Hamilton, Brook, Smith & Reynolds, P.C.

(57) ABSTRACT

The present invention relates to a method and system for performing a finite element simulation. Embodiments of the present invention determine accurate contact simulations. A method according to the principles of the present invention begins by obtaining a first finite element model and a first computer aided design (CAD) model that the first finite element model represents. Next, a finite element simulation is performed using at least the first finite element model and the first CAD model. According to an embodiment of the present invention, performing the finite element simulation comprises determining one or more variations between the first finite element model and the first CAD model.

20 Claims, 8 Drawing Sheets
(3 of 8 Drawing Sheet(s) Filed in Color)

(56) References Cited

OTHER PUBLICATIONS

Attene, M., et al., "Polygon Mesh Repairing: An Application Perspective", *ACM Computing Surveys*, 45(2):15.1-15.33 (2013).
European Search Report, EP 14196679.6, "CAD-Based Initial Surface Geometry Correction," dated May 27, 2015.
Lu, Jia, "Isogeometric contact analysis: Geometric basis and formulation for frictionless contact", *Comput. Methods Appl. Mech. Engrg.*, 200:726-741 (2011).
Neto, D.M., et al., "Improving Nagata patch interpolation applied for tool surface description in sheet metal forming simulation", *Computer-Aided Design*, 45:639-656 (2013).

\* cited by examiner

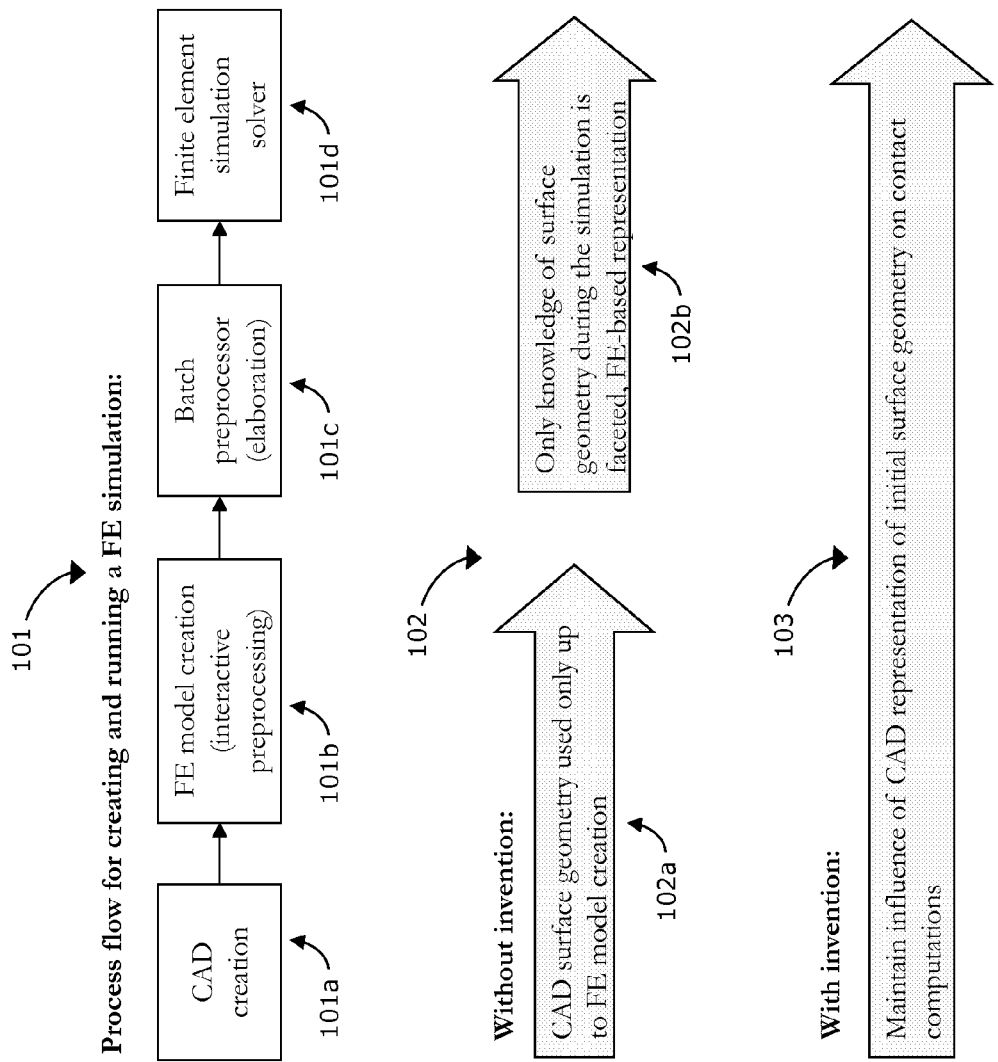
Figure: 1

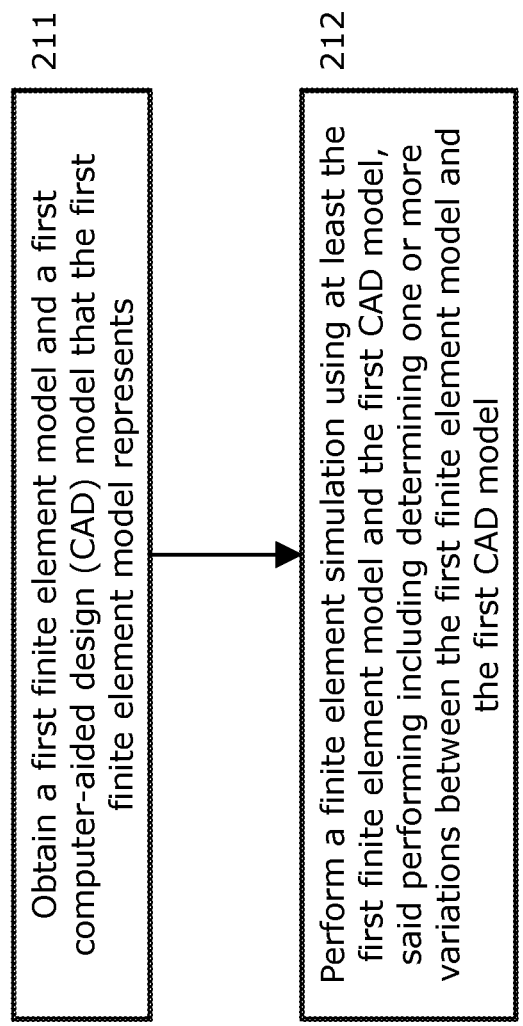
Figure: 2

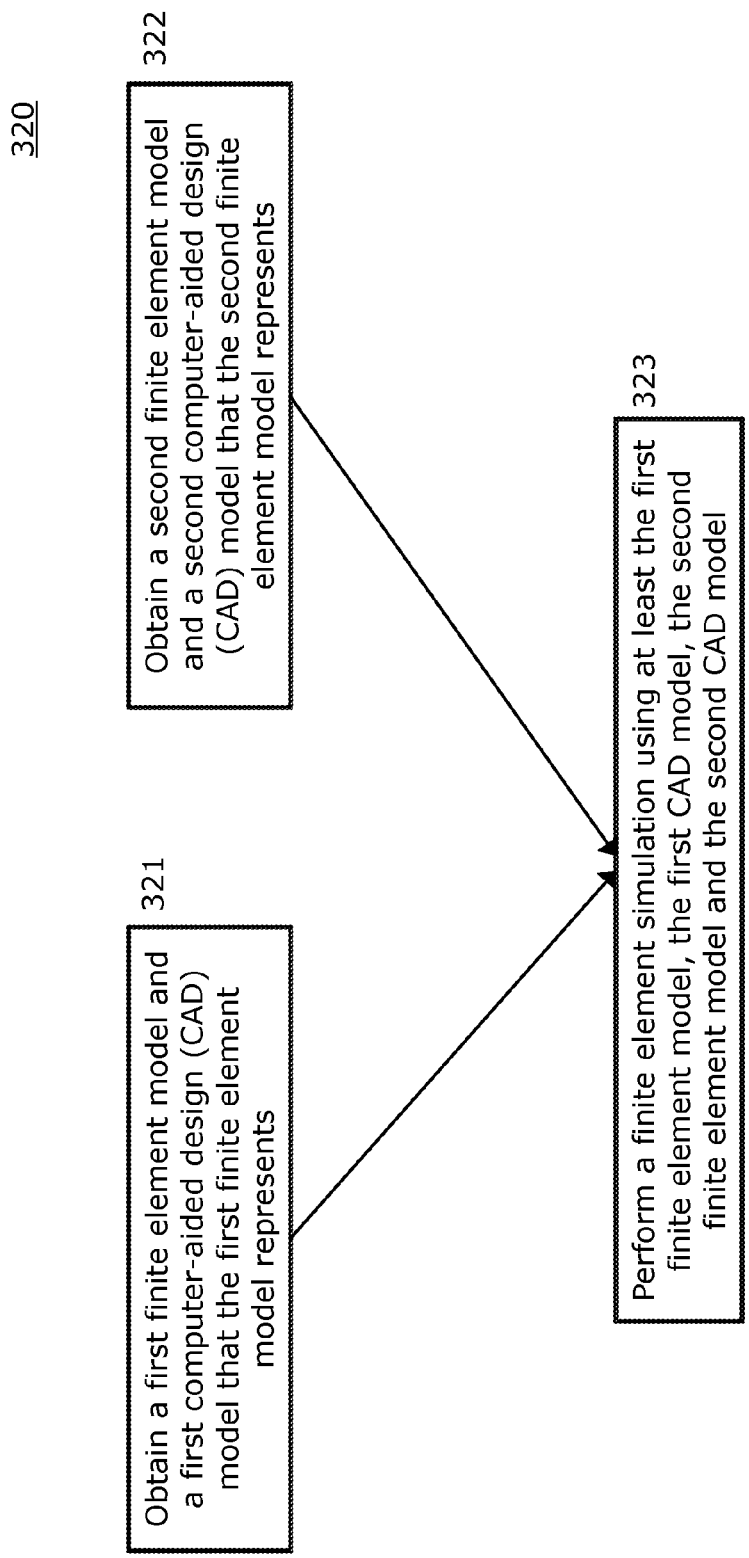
Figure: 3

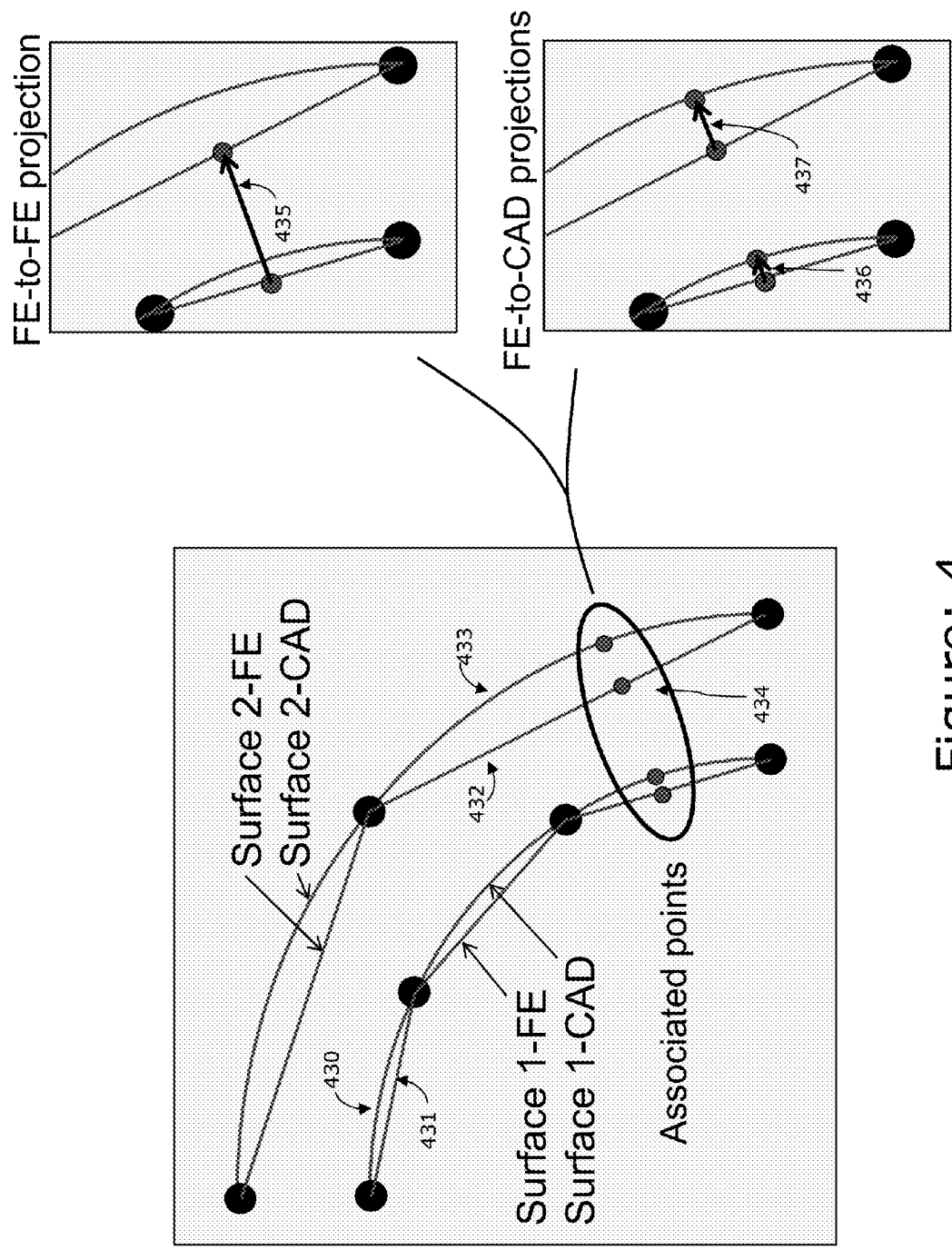
Figure: 4

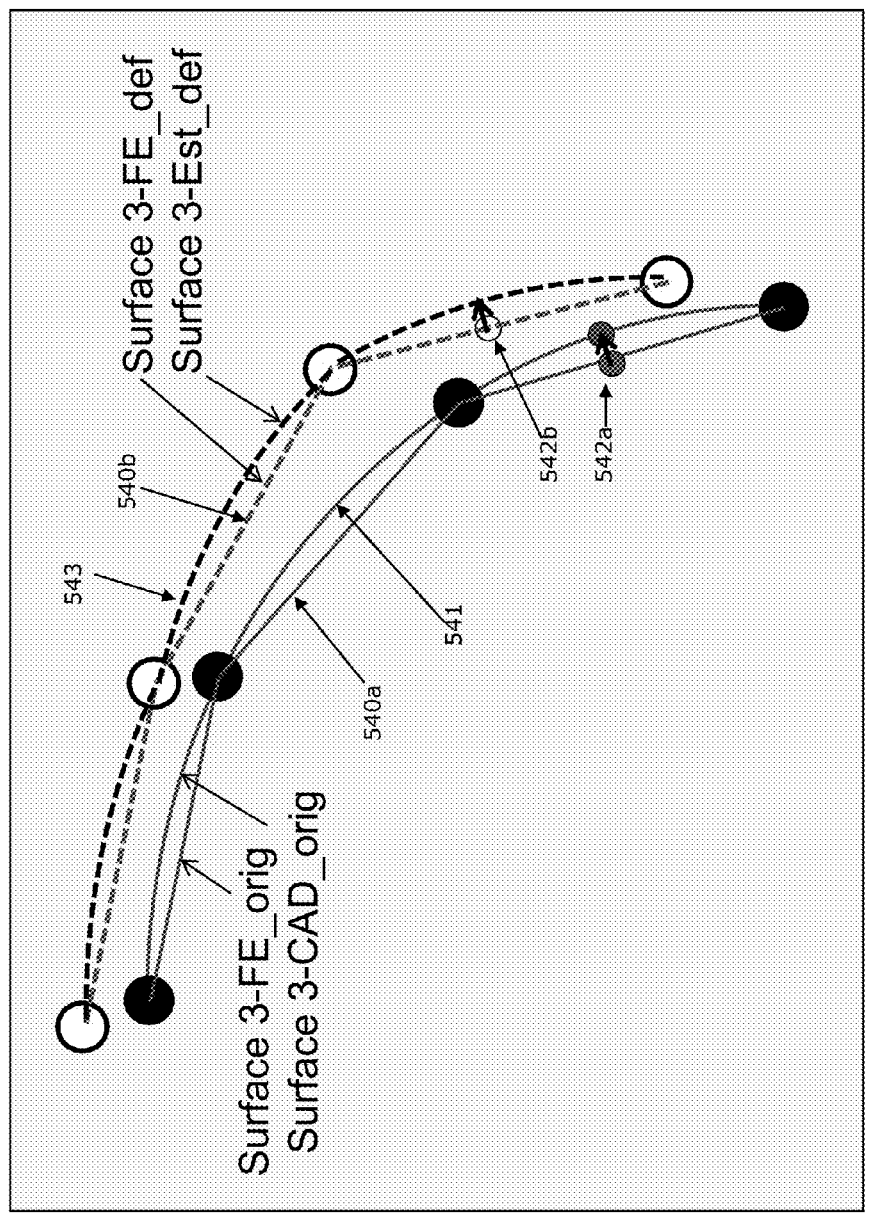
Figure: 5

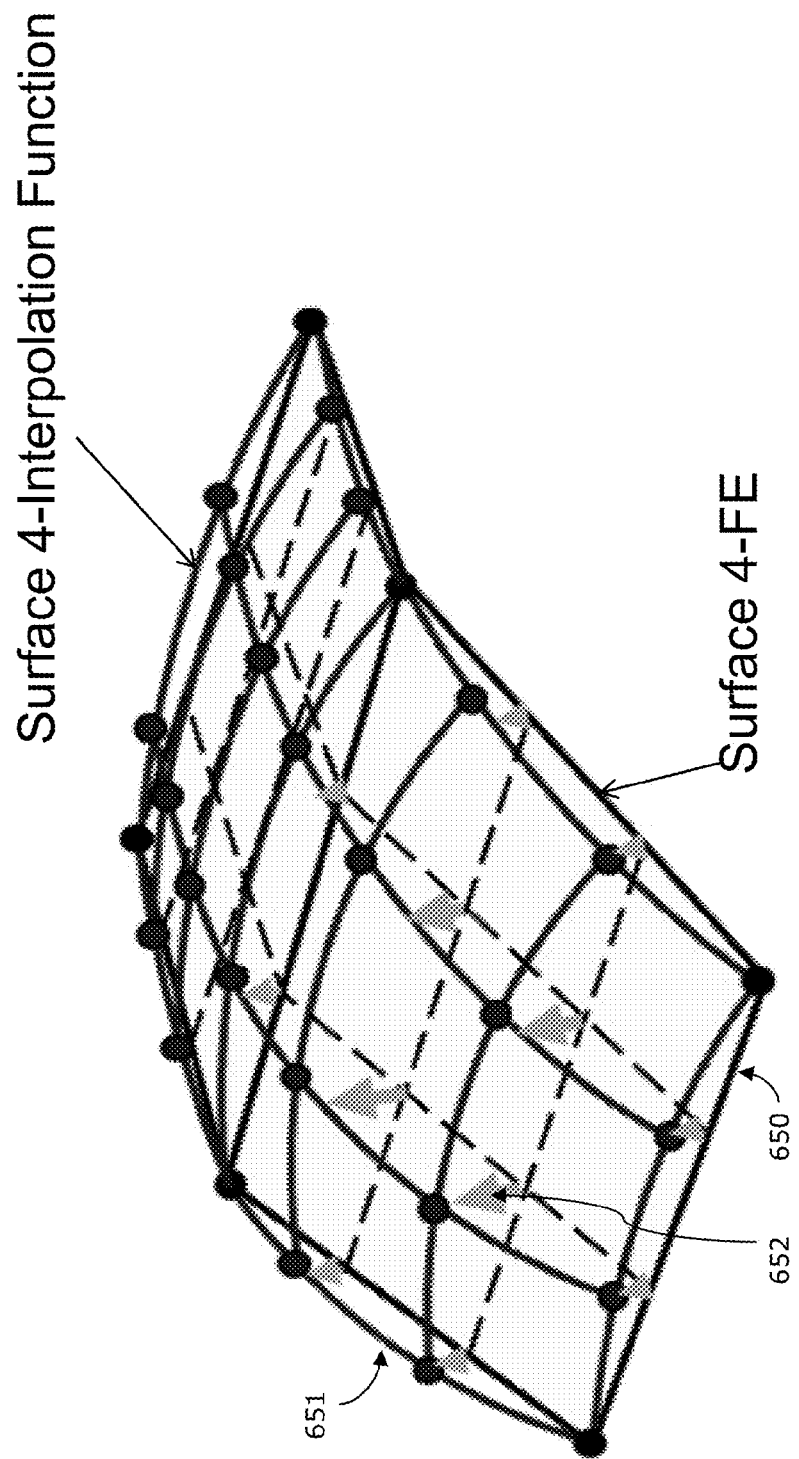
Figure: 6

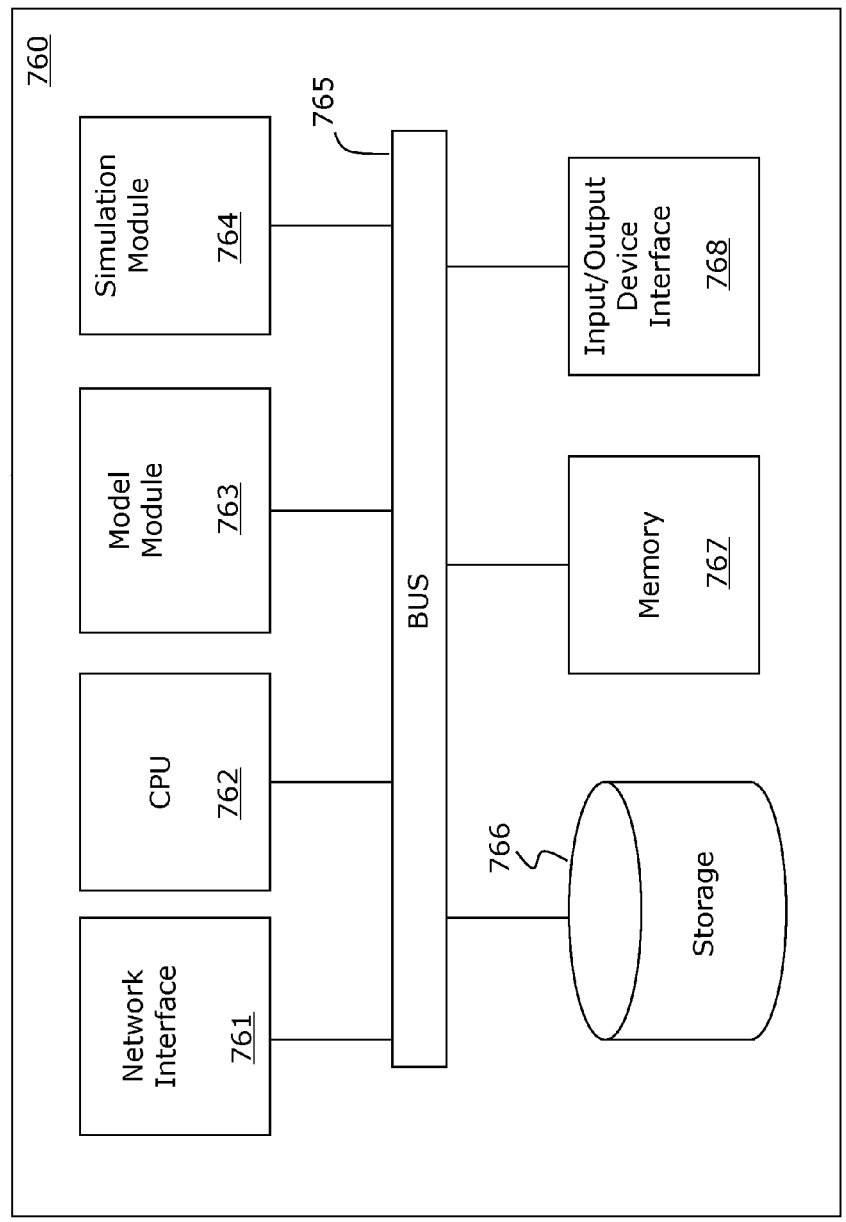
Figure: 7

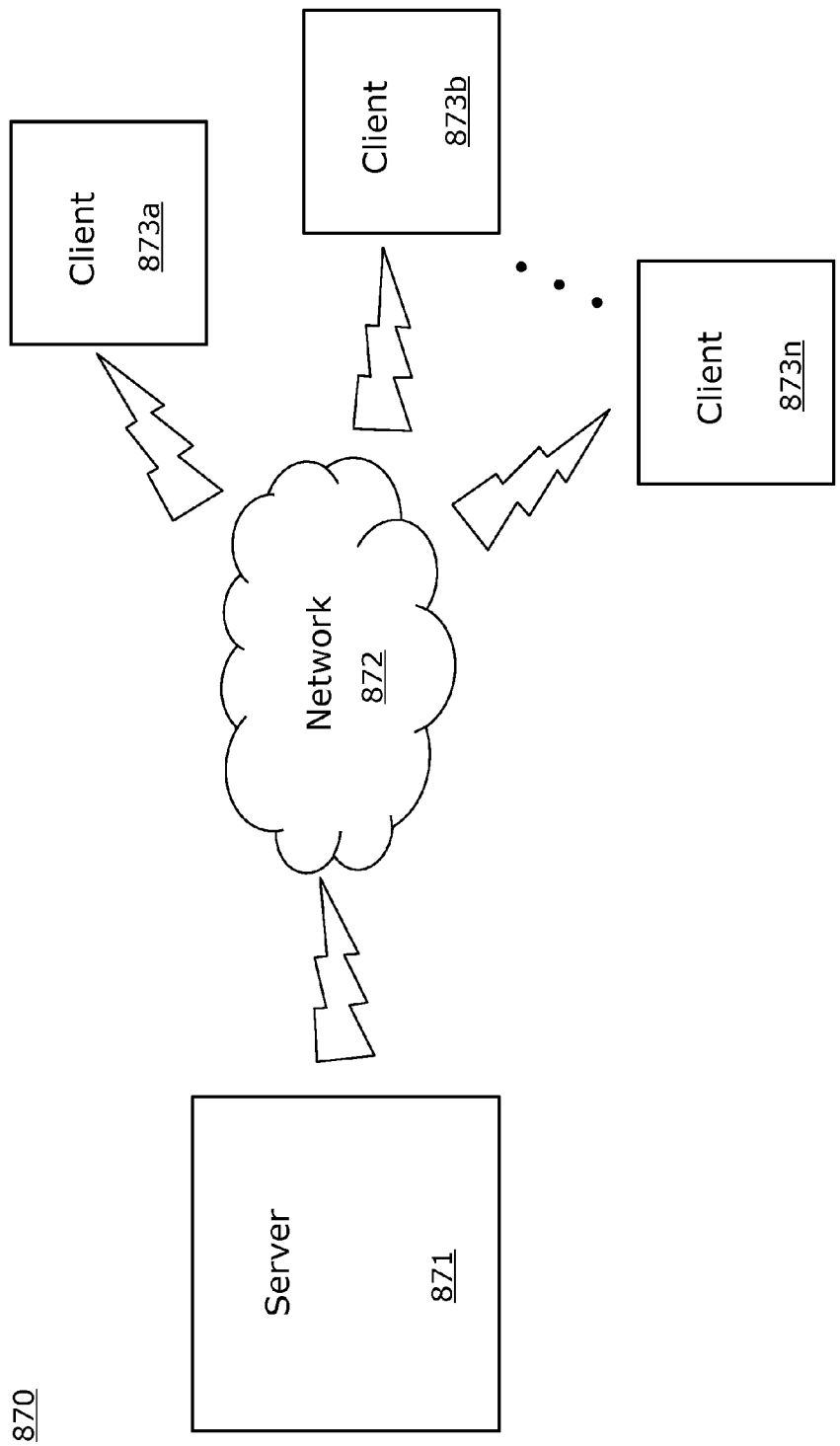
Figure: 8

CAD-BASED INITIAL SURFACE GEOMETRY CORRECTION

BACKGROUND OF THE INVENTION

The invention generally relates to the field of computer programs and systems, and specifically to the field of computer aided design (CAD), computer-aided engineering (CAE), modeling, and simulation.

A number of systems and programs are offered on the market for the design of parts or assemblies of parts. These so called CAD systems allow a user to construct and manipulate complex three-dimensional models of objects or assemblies of objects. CAD systems thus provide a representation of modeled objects using edges or lines, in certain cases with faces. Lines, edges, faces, or polygons may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects—the typical size of the file representing an object in a CAD system ranges, but is typically on the megabyte order of magnitude for a part. An assembly may contain thousands of parts, and an assembly file is correspondingly large. A CAD system manages models of objects, which are stored in electronic files.

The advent of CAD and CAE systems allows for a wide range of representation possibilities for objects. One such representation is a finite element analysis (FEA) model. The terms FEA model, finite element (FE) model, finite element mesh, and mesh are used interchangeably throughout this application. A FE model typically represents a CAD model, and thus, may represent one or more parts or an entire assembly. A FE model is a system of points called nodes which are interconnected to make a grid, referred to as a mesh. The FE model may be programmed in such a way that the FE model has the properties of the underlying object or objects that it represents. When a FE model is programmed in such a way, it may be used to perform simulations of the object that it represents. For example, a FE model may be used to represent the interior cavity of a vehicle, the acoustic fluid surrounding a structure, and any number of real-world objects, including medical devices such as stents. When a given FE model represents an object and is programmed accordingly it may be used to simulate the real-world object itself. For example, a FE model representing a stent may be used to simulate the use of the stent in a real-life medical setting.

The usefulness of a finite element simulation however is limited by the accuracy of the simulation itself. For example, a common error in finite element simulations is a penetration, i.e., the simulation generating a result indicating that a surface of a FE model has been breached, or has breached a surface of another FE model, or a false gap between two surfaces that are in contact. While there are existing solutions to compensate for these errors, and enhance the accuracy of the finite element simulation, the existing solutions are inadequate.

Finite element simulations often involve contact between curved surfaces. A successful finite element simulation of the contact between curved surfaces typically relies on good resolution of these interfaces. However, faceted representations of surfaces based on exposed sides of finite elements are often not highly representative of the true geometry. This frequently results in various difficulties in robustly getting a simulation started and often causes significant inaccuracy to solution results of interest.

Two methods exist in the art to handle these errors. One is known as the Isogeometric Finite Element method, in which the finite element formulation is directly based on CAD-type spatial interpolation (NURBS, etc.). Professor Thomas J. R. Hughes has been a lead researcher and proponent of this approach. Some form of this approach has been adopted in LS-Dyna® and perhaps other CAD Systems.

Another known method for handling these errors is through circumferential and spherical smoothing capability. With this capability, the user indicates the approximate cylindrical axis for circumferential smoothing or the approximate spherical center for spherical smoothing. If the CAD geometry is known the process will automatically write the cylindrical axis or spherical center for portions of finite element based surfaces whose associated CAD geometry is precisely axisymmetric or spherical, respectively. This method introduces corrections to penetration/gap distance calculations based on differences between initial CAD and finite-element representations of a given surface.

Disadvantages of the Isogeometric Finite Element method include a high level of connectivity resulting in quite a full population of a stiffness matrix. Also a higher-order of continuity of interpolators can be disadvantageous for some types of deformation modes. Further, the method is non-intuitive (for example control points are not on the true surface).

Drawbacks and limitations of the circumferential/spherical smoothing method include the tediousness of operation for users to specify the cylindrical axes or spherical center in some cases. Further, this method is only applicable to certain surface shapes.

SUMMARY OF THE INVENTION

Thus, a method of improving the accuracy of a finite element simulation is needed. Embodiments of the present invention make it more straightforward to perform finite element analyses involving contact of curved surfaces.

Applicants previously implemented a method to improve contact treatment for specific common curved geometry types, such as cylinders, cones, and spheres. With the present invention, Applicants extend the prior method to more general curved surface types. Preprocessing (mesh generation) for a finite element analysis often starts with a computer-aided design (CAD) geometry description that is very accurate. Embodiments of the present invention use CAD surface information to account for the difference between the initial finite element geometry and the initial true geometry.

A method and corresponding system, according to an embodiment of the present invention are directed to performing a finite element simulation. An embodiment of the present invention begins by obtaining a first finite element model and a first CAD model that the first finite element model represents. Next, the method continues by performing a finite element simulation using at least the first finite element model and the first CAD model wherein said performing includes determining one or more variations between the first finite element model and the first CAD model.

According to an embodiment of the present invention the finite element simulation comprises determining one or more variations between the first finite element model and the first CAD model. In such an embodiment, the one or more variations between the first finite element model and the first CAD model may include a distance between a facet of the first finite element model and a surface of the first CAD model. According to an embodiment, this distance may be a distance between the first finite element model as initially obtained, i.e., prior to performing any simulations or any simulations that deform the finite element model, and a surface of the first CAD model. In yet another embodiment of the present invention, the method further comprises obtaining a second finite element model and a second CAD model that the second finite element model represents. Further, in such an embodiment, performing the finite element simulation comprises simulating contact between the first finite element model and the second finite element model. Furthermore, the finite element simulation is performed using, in addition to the first finite element model, the second finite element model, and the second CAD model. According to an embodiment of the present invention that further comprises obtaining a second finite element model a second CAD model and performing the finite element simulation using the same, in such an embodiment, performing the finite element simulation comprises utilizing the first CAD model and the second CAD model to determine one or more errors in the finite element simulation. In an example embodiment, the one or more errors in the finite elements simulation may be at least one of a gap and a penetration.

An alternative embodiment of the invention comprises obtaining a first finite element model, a first CAD model, and a second CAD model. Such an embodiment further comprises performing a finite element simulation simulating contact between the first finite element model and the second CAD model and the finite element simulation is performed using the first finite element model, first CAD model, and the second CAD model. Yet further still, in such an embodiment of the present invention, the second CAD model may be treated as a rigid body in the finite element simulation.

According to an embodiment of the present invention, performing the finite element simulation comprises generating one or more interpolation functions based upon the first CAD model and utilizing the interpolation functions to perform the finite element simulation. In such an embodiment, the interpolation functions may approximate geometry of the first CAD model. In yet another embodiment of the present invention, the first finite element model represents at least two parts and the finite element simulation simulates contact between the at least two parts.

An alternative embodiment of the present invention is directed to a system for performing a finite element simulation. In such an embodiment, the system comprises a model module configured to obtain a first finite element model and a first CAD model that the first finite element model represents. The system may further comprise a simulation module configured to perform a finite element simulation using at least the first finite element model and the first CAD model, said performing including determining one or more variations between the first finite element model and the first CAD model. According to an embodiment of the present invention the one or more variations between the first finite element model and the first CAD model includes a distance between a facet of the first finite element model and a surface of the first CAD model.

In an alternative embodiment of the system, the model module is further configured to obtain a second finite element model and a second CAD model that the second finite element model represents. Further, in such an embodiment, the finite element simulation comprises simulating contact between the first finite element model and the second finite element model and the simulation module is further configured to use the second finite element model and the second CAD model to perform the finite element simulation.

In an embodiment of the system further configured to obtain a second CAD model, the simulation module may be configured to utilize the first CAD model and the second CAD model to determine one or more errors in the finite element simulation. In such embodiment, the one or more errors in the finite element simulation is an error in the simulated contact being at least one of a gap and a penetration.

According to yet another embodiment of the system, the model module is configured to obtain a second CAD model. Further, the simulation module is further configured to perform the finite element simulation using the second CAD model and the finite element simulation simulates contact between the first finite element model and the second CAD model. In yet another embodiment of the present invention, the simulation module is configured to treat the second CAD model as a rigid body in the finite element simulation.

According to an embodiment of the system, the simulation module may be further configured to generate one or more interpolation functions based upon the first CAD model and in such an embodiment the simulation module may be further configured to perform the finite element simulation using the generated interpolation functions. In such an embodiment of the system, the interpolation functions may approximate geometry of the first CAD model. In alternative embodiments of the present invention, interpolation functions may be generated for any CAD models involved in the simulation. In yet another embodiment of the system, the first finite element model represents at least two parts and the finite element simulation simulates contact between the at least two parts.

Another embodiment of the present invention is directed to a cloud computing implementation for performing finite element simulations. Such an embodiment is directed to a computer program product executed by a server in communication across a network with one or more clients. The computer program product comprises a computer readable medium that comprises program instructions which, when executed by a processor, causes: obtaining a first finite element model and a first computer-aided design model that the first finite element model represents; and performing a finite element simulation using at least a first finite element model and the first CAD model, said performing including determining one or more variations between the first finite element model and the first CAD model. According to an embodiment of the present invention, in the computer program product, the one or more variations between the first finite element model and the first CAD model includes a distance between a facet of the first finite element model and a surface of the first CAD model.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1 is a schematic overview of embodiments of the present invention.

FIG. 2 is a flow chart depicting a method of performing a finite element simulation according to principles of the present invention.

FIG. 3 is a flow chart depicting a method of performing a finite element simulation of contact between two finite element models according to an embodiment of the invention.

FIG. 4 is a schematic view of CAD and finite element representations as implemented in embodiments of the present invention.

FIG. 5 is a schematic view of various representations of a surface as implemented in embodiments of the present invention.

FIG. 6 is a schematic view of a finite element model and interpolation functions according to an embodiment of the present invention.

FIG. 7 is a simplified block diagram illustrating a system according to the principles of the present invention.

FIG. 8 is a simplified diagram of a computer network environment in which an embodiment of the present invention may be embodied.

DETAILED DESCRIPTION OF THE INVENTION

A description of example embodiments of the invention follows.

The teachings of all patents, published applications and references cited herein are incorporated by reference in their entirety.

The present invention accounts for (in some cases approximately) the difference between the finite-element representation of the initial surface geometry (which is often quite poor) and the CAD representation of the initial surface geometry (which is typically very accurate) in a finite element analysis. The terms finite element analysis (FEA) and finite element (FE) simulation are used interchangeably throughout this application.

Relative to the isogeometric finite element method described hereinabove, embodiments of the present invention can be used with standard finite elements and preserve the many good and robust characteristics of standard finite element simulation methods. With respect to a current finite element simulation workflow in which CAD representations are already used as input to the mesh generation task, the embodiments of the present invention can be activated by default, with minimal likelihood of disruption or negative effects.

Relative to pre-existing circumferential and spherical smoothing methods, embodiments of the present invention are applicable to general surface shapes. The present invention does not rely on an assumption that initial positions of surface nodes are precisely located on the initial true geometry.

A purpose of the present invention is to improve penetration or gap distance calculations for contact in a finite-element simulation or other type of simulation. As shown in FIG. 1, a fundamental aspect of the invention is to maintain influence of more accurate CAD representations of the initial surface geometry on contact computations during the finite element simulation; whereas, without this invention the CAD surface representation is only used up to the end of the FE model creation phase.

FIG. 1 is a schematic overview of embodiments of the present invention. In FIG. 1, the process 101 illustrates the process flow for creating and running a finite element simulation. The process 102 illustrates the influence of a CAD model on the process 101 of creating and running a finite element simulation according to principles as are known in the art. The process 103 illustrates the influence of a CAD model on the process 101 of creating and running a finite element simulation according to the principles of the present invention.

The process 101 begins by creating a CAD model (101a). The CAD model may be created according to any method as is known in the art. For example, the CAD model may be created using any variety of software suites directed to such applications. After creating the CAD model (101a), the next step in the process 101 is to create the finite element model (101b). Creating the finite element model (101b) may be referred to as interactive preprocessing. The finite element model creation step 101b may comprise uploading or importing the CAD model (created in step 101a), defining material properties, ensuring there are no clashes within the finite element model and defining any number of aspects of the finite element model, such as friction coefficients. The steps for creating the finite element model (101b) may include any methods for creating a finite element model as are known in the art. After creating the finite element model (101b), the next step of the process 101 for creating and running a finite element simulation is batch preprocessing (101c) which may be referred to herein as elaboration. Batch preprocessing (101c) may include organizing the data of the finite element simulation and ensuring the integrity of the finite element model created in step 101b. The final step of the process 101 is to execute the finite element solver (101d). The finite element solver 101d may be carried out according to principles as are known in the art or according to principles as described hereinbelow, for example using the methods of performing a finite element simulation described below in relation to FIG. 2. The process 101 generally illustrates the process for performing a finite element simulation as is known in the art. However, embodiments of the present invention modify the traditional finite element simulation by maintaining the influence of the CAD model throughout the process 101.

The process flow 102 illustrates the influence of the CAD model on the process 101 according to principles as are known in the art. As shown in FIG. 1, according to traditional principles of finite element simulation, the process flow 101 is only affected by the CAD model during steps 101a and 101b. This is shown by the portion 102a of the flow 102. According to principles as are known in the art, the CAD surface geometry is used only up to the finite element model creation which includes steps 101a and 101b of the process flow 101 for creating and performing a finite element simulation. During batch preprocessing, 101c, and the finite element simulation 101d, the only knowledge of the surface geometry during these steps is the faceted finite element-based representation. Thus, according to traditional methods of performing a finite element simulation, only the finite element model is used during batch preprocessing (101c) and when executing the finite element simulation solver (101d).

However, in embodiments of the present invention, the influence of the CAD representation of the initial surface geometry on contact computations is maintained throughout the process flow for creating and running the finite element simulation as shown by the process flow 103. In the prior art, the CAD model is only used throughout steps 101a and 101b of the process flow for creating and running a finite element simulation 101. However, in embodiments of the present invention, the CAD model's influence is maintained throughout steps 101a-d of the process flow 101. Thus, embodiments of the present invention utilize the CAD model throughout all steps of performing the finite element simulation.

FIG. 2 is a flowchart depicting a method of performing a finite element simulation according to principles of the present invention. The method 210 begins by obtaining a first finite element model and a first CAD model that the first finite element model represents (211). The first finite element model and the first CAD model may be obtained through any means as is known in the art. For example, the first finite element model and the first CAD model may be obtained from a point communicatively coupled to a computer performing the method 210. Further, the first finite element model and the first CAD model may be obtained via a communications network, such as a local area network (LAN) or wide area network (WAN). Further, in yet another embodiment of the method 210, the first finite element model and the first CAD model may be uploaded to a computer operating the method via known communication means such as through any communication port as is known in the art.

After obtaining the first finite element model and the first CAD model, the method 210 concludes by performing a finite element simulation using the first finite element model and the first CAD model (212), wherein said performing includes determining one or more variations between the first finite element model and the first CAD model. As noted hereinabove, according to an embodiment of the method 210, the finite element simulation is performed using at least the first finite element model and the first CAD model, thus, in other embodiments of the invention, the finite element simulation may be performed using one or more other CAD models and/or finite element models.

Further, in another embodiment of the method 210 for performing a finite element simulation, the finite element simulation is performed using only the first finite element model and the first CAD model and no other elements are necessary for performing the finite element simulation. In such an embodiment, the finite element simulation may simulate self-contact, i.e., contact between components of the first finite element model. As described hereinabove, a CAD model may represent a real world object, for example a car, and similarly, a finite element model may represent the CAD model. A finite element simulation may be performed to simulate the real word use of the car. In such an embodiment of the method 210, the CAD model may represent several parts of the car, for example a wheel, axel, and chassis. Further, the finite element model may represent the three parts, and be composed of three components representing each part. According to an embodiment of the method 210, the method 210 simulates contact between the multiple components of the finite element model. In yet another embodiment of the method 210, the method 210 is used to perform a finite element simulation between contact of curved surfaces.

According to an embodiment of the method 210, performing a finite element simulation using the first finite element model and the first CAD model (212), comprises determining one or more variations between the first finite element model and the first CAD model. In such an embodiment, the first finite element model and the first CAD model are used in conjunction in the finite element simulation to yield a more accurate result. For example, if the finite element model represents a wheel and axel, the step 212 may simulate contact between the wheel and axel. However, the most accurate representation of the wheel and axel may be given by the CAD model. Thus, in an embodiment of the method 210, the CAD model influences the finite element simulation to yield the most accurate simulation of contact between the wheel and axel. According to an embodiment of the method 210, the variations may be between the initial first finite element model, i.e., before the first finite simulation is deformed, and the first CAD model. Throughout, embodiments of the present invention, variations between the initial finite element models and CAD models may be used throughout the finite element simulation.

In an embodiment of the present invention, the one or more variations between the first finite element model and the first CAD model includes a distance between a facet of the first finite element model and a surface of the CAD model. As is known in the art, a finite element model is typically faceted. However, a CAD model is typically represented more smoothly by surface geometry. Thus, according to an embodiment of the invention, performing the finite element simulation comprises determining one or more variations between one or more facets of a finite element model and the corresponding area of a CAD model that the first finite element model represents. For example, in an embodiment of the method 210, the one or more variations between the first finite element model and the first CAD model includes a distance between a facet of the first finite element model and a surface of the first CAD model. Yet further still, in an embodiment of the present invention, the one or more variations between the first finite element model and the first CAD model may be, amongst others, a geometric variation, i.e. a variation between the geometry of the CAD model and the geometry of the finite element model. Furthermore, the variations described herein may be determined using the initial first finite element model, as described herein, and the first CAD model. For example, in an embodiment of the method 210 wherein the first finite element model is deformed when performing the finite element simulation (212), a variation between the initial first finite element model and the first CAD model may be used throughout performing the finite element simulation (212). Further detail regarding the one or more variations is described hereinbelow in relation to FIGS. 4 and 5.

According to an alternative embodiment of the present invention, performing a finite element simulation using at least the first finite element model and the first CAD model, 212, comprises generating one or more interpolation functions based upon the first CAD model and utilizing the interpolation functions to perform the finite element simulation. In such an embodiment, the one or more interpolation functions may approximate one or more variations between the first finite element model and the first CAD model. Further detail regarding generating interpolation functions and performing a finite element simulation using the same according to principles of the present invention are described hereinbelow in relation to FIG. 6.

In yet another embodiment of the method 210, the first finite element model represents at least two parts. In such an embodiment, the finite element simulation simulates contact between the at least two parts. Embodiments of the method 210 may be configured to simulate contact between any number of components, i.e. parts of a finite element model. Further embodiments of the method 210 may also perform finite element simulations involving parts of separate finite element models. Thus, embodiments of the present invention may be utilized to perform any finite element simulation as known in the art.

In yet another embodiment of the method 210, the method further comprises obtaining a second CAD model. In such an embodiment, performing a finite element simulation using at least the first finite element model and the first CAD model, 212, comprises simulating contact between the first finite element model and the second CAD model and the finite element simulation is further performed using the second CAD model. In an alternative embodiment, instead of performing the finite element simulation using a respective finite element model that represents the second CAD model, the second CAD model may be treated as a rigid body in the finite element simulation.

Embodiments of the method may be used to perform a finite element simulation of contact, for example, the contact between two parts represented by the first finite element model and the first CAD model. In such an embodiment, performing the finite element simulation comprises utilizing the first CAD model and the first finite element model to determine one or more errors in the finite element simulation. According to an embodiment of the present invention, the one or more errors in the finite element simulation is an error in the simulated contact being at least one of a gap and a penetration.

FIG. 3 is a flowchart depicting a method of performing a finite element simulation of contact between two finite element models according to an embodiment of the present invention. The method 320 begins by obtaining a first finite element model and a first CAD model that the first finite element model represents (321). Next, a second finite element model and a second CAD model is obtained that the second finite element model represents (322). The finite element models and the CAD models may be obtained through any means known in the art. Further, while described as being performed in two separate steps, 321 and 322 respectively, the finite element models and the CAD models may be obtained simultaneously, and/or in one step. For example, the first finite element model, the first CAD model, the second finite element model, and the second CAD model may be transferred to a computer executing an embodiment of the present invention via a LAN or WAN. After steps 321 and 322, the next step of the method 320 is to perform a finite element simulation using at least the first finite element model, the first CAD model, the second finite element model, and the second CAD model (323). In an embodiment of the method 320, performing the finite element simulation 323, comprises determining one or more variations between the first finite element model and the first CAD model, and the second finite element model and the second CAD model. Yet further still, in an embodiment of the method 320, step 323 may comprise simulating contact between the first finite element model and the second finite element model.

According to yet another embodiment of the method 320, performing the finite element simulation 323 comprises utilizing the first CAD model and the second CAD model to determine one or more errors in the finite element simulation. In such an embodiment, the one or more errors in the finite element simulation may be an error in the simulated contact. Further, in such embodiment the error in the simulated contact may be at least one of a gap and a penetration. Yet further still, the errors may include a gap that is smaller or larger than the true gap. Further, the errors may include a false gap which does not exist, a penetration smaller or larger than the true penetration, and a false penetration which does not exist. These errors in gaps and penetrations may be in relation to the contact between the finite element models or the CAD models in the finite element simulation. As described herein, the finite element simulation may provide a simulation of real world objects. In such an embodiment, the CAD models are a more accurate representation of the real word objects and thus, the errors described herein may be in relation to the CAD models. In an embodiment of the invention wherein the finite element simulation simulates contact between components of a CAD model, the errors may be in relation to these components of the CAD model.

While the method 320 is described as a separate method, components of the method 320 may be incorporated in the method 210. In such an embodiment, the method 210 may comprise obtaining a first finite element model and a first CAD model that represents the first finite element model and, like the method 320, obtaining a second CAD model and a second finite element model. Next, the finite element simulation will be performed using the obtained finite element models and CAD models. Further, embodiments of the present invention are not limited to performing a finite element simulation using two sets of respective finite element models. Embodiments of the present invention may perform finite element simulations using any number of finite element models and CAD models. In an embodiment of the present invention wherein the method begins by obtaining both a first finite element model and first CAD model and a second finite element model and a second CAD model, the finite element simulation may simulate contact between the first finite element model and the second finite element model.

A simple two-dimensional example of performing a finite element simulation of contact is shown in FIG. 4. The true (CAD) geometries, shown in red in FIG. 4, are smooth in this case; and the finite-element representations, shown in blue, are faceted. The distance between two finite element based surfaces can be quite different than the distance between the true surface geometries. Accounting for the difference between the initial CAD geometry and the initial finite element geometry for each of the surfaces involved can dramatically improve the accuracy of the penetration/gap computation. The invention can be implemented such that initial geometry corrections could be based on projections for finite-element to CAD geometry during a simulation, such as depicted in FIG. 4.

FIG. 4 is a schematic view of CAD and finite element representations as implemented in embodiments of the present invention. Depicted in FIG. 4 is a first finite element model 431, the respective first CAD model 430, a second finite element model 432 and a second CAD model 433. The CAD models 430 and 433 and the finite element models 431 and 432 are simplified versions of finite element and CAD models. In FIG. 4, the finite element models 431 and 432 are depicted in blue and the CAD models 430 and 433 are depicted in red. In an example embodiment, the CAD models 430 and 433 and finite element models 431 and 432 may be used to simulate a pipe inside another pipe. Thus, FIG. 4 may depict a quarter section of a pipe inside a quarter section of another pipe.

In an embodiment of the present invention configured to perform a finite element simulation, the method would begin by obtaining the finite element models 431 at 432 and CAD models 430 and 433. Next, a finite element simulation will be performed using the CAD models 430 and 433 and the finite element models 431 and 432. As shown herein, the CAD models 430 and 433 are smooth and may be representative of the true CAD geometries of the respective pipes. The finite element models 431 and 432 however, are faceted as is shown in FIG. 4. Mismatches in the representations of the facets of the finite element models 431 and 432 may cause penetrations and or gaps in the finite element simulations. As is shown in FIG. 4, the finite element model 431 is comprised of three facets while the finite element model 432 is comprised of two facets. Because of the mismatch, the finite element simulation may not be an accurate representation of penetrations or gaps between the finite element models 431 and 432.

Thus, embodiments of the present invention wherein the finite element models and respective CAD models are used to perform the finite element simulation of the contact between the finite element models 431 and 432, the effect of these gaps or penetrations and/or the mismatch in the facets of the finite models 431 and 432 may be alleviated through using principles of the present invention. For example, the associated points 434 in FIG. 4 may be used to determine errors in contact. To determine these errors, first a distance may be found between the facets. This distance 435 is depicted in FIG. 4. Next, the distances between a facet of the finite element model 431 and CAD model 430 and the finite element model 432 and CAD model 433 are determined, as shown at 436 and 437 respectively. The distance 436 is the distance between the facet of the finite element model 431 and the surface of the CAD model 430. Similarly, the distance 437 is the distance between the finite element model 432 and the surface 433 at the associated points 434. Given the distance between the two facets 435 and the distances between the facets and corresponding CAD surfaces, 436 and 437, one may determine the distance between the surfaces 433 and 430 at the associated points. This distance may be used to accurately determine a penetration or gap in the finite element simulation of contact between the surfaces 430 and 433. Errors that may be determined using such methods as described herein may be a gap that is smaller or larger than the true gap, a false gap which does not exist between the between CAD models, a penetration smaller or larger than the true penetration, or a false penetration which does not exist.

While embodiments of the present invention described herein are utilized to perform a finite element simulation of contact between finite element models. Embodiments of the present invention are not so limited and may be used to model amongst other things constraints, i.e. adhesion between two parts.

FIG. 5 is a schematic view of various representations of a surface as implemented in embodiments of the present invention. In FIG. 5, the solid red line represents the original CAD surface geometry 541. The solid blue line represents the original finite element geometry 540a of the CAD surface 541. However, throughout performing the finite element simulation, the finite element model 540a has been deformed as shown by the dashed blue line 540b which represents the finite element model 540a after deformation. As described herein, embodiments of the present invention utilize a CAD model, such as the CAD surface 541 throughout performing a finite element simulation. In an example embodiment of the present invention wherein the finite element model is deformed when performing the finite element simulation as depicted in FIG. 5, the principles of the present invention may be utilized to determine one or more variations or errors in the finite element simulation. As described herein in relation to FIG. 4, the distance between a facet of a finite element model and a CAD model may be used in an embodiment of the present invention during the finite element simulation to more accurately perform the finite element simulation. In FIG. 5, 542a shows a correction distance at a point on a finite element facet established in the original configuration and then the same distance 542b may be applied in the deformed configuration. Thus, utilizing principles of the present invention, this correction distance 542a and 542b are used throughout the finite element simulation even when the finite element model 540a is deformed throughout performing the finite element simulation.

The dashed black line, 543 in FIG. 5, represents an estimate of the deformed surface geometry. In an embodiment of the invention, the line 543 is determined when performing the finite element simulation. In such an embodiment, the line 543 corresponds to the deformed finite element geometry 540b plus one or more variations, such as the distance 542a, between the initial CAD model 541 and the initial finite element geometry 540a. These variations may be used to generate the line 543. The line 543 is generated and used in embodiments of the present invention because the true deformed CAD geometry is not known. An assumption of a constant correction distance from the finite element model surface may result in a more accurate estimate of the deformed surface geometry than the deformed finite element surface geometry alone, particularly when strains in underlying elements of the finite element model are small. In FIG. 5 for example, the correction distance 542a, that is determined in the original configuration, may be used throughout performing a finite element simulation to determine a more accurate estimate of the surface geometry, i.e., 543, than the deformed finite element surface 540b geometry alone. This approximation of the deformed geometry 543 can then be utilized when performing the finite element simulation to yield a more accurate result.

In an embodiment, the improved estimate of the surface geometry, depicted by the line 543 is based on applying the correction distance 542b, which is based on the difference between the original CAD 541 geometry and the original finite element model 540a geometry to the deformed finite element geometry 540b. While utilizing a correction distance 542a to perform a finite element simulation of a single finite element model that is deformed throughout performing a finite element simulation is shown; these principles may be utilized for any number of finite element models and CAD models in a simulation. Further, these principles may be used throughout various different finite element points in a finite element model that is being used in a finite element simulation being carried out according to principles of the present invention. Furthermore, while FIG. 5 illustrates using a constant correction distance, 542a, embodiments of the present invention are not so limited. In an alternative embodiment, a variation between a finite element model and a respective CAD model that is identified in the original configuration, i.e., prior to deformation, can be altered and used when performing a finite element simulation. According to an example embodiment of the present invention, the correction distance 542a that was determined in the original configuration may be modified, i.e., increased or decreased, based upon factors in the finite element simulation. For example, in embodiment of the present invention the correction distance 542a may be increased or decreased based on strains in underlying elements of the finite element model and then used to determine an improved estimate of the deformed surface geometry.

FIG. 6 is a schematic view of a finite element model and interpolation functions according to an embodiment of the present invention. As described herein, embodiments of the present invention utilize a CAD model when performing a finite element simulation. However, utilizing the actual CAD geometry for every process of the finite element simulation may become computationally expensive. Thus, according to an embodiment of the present invention, utilizing a CAD model during a finite element simulation comprises generating interpolation functions that represent the CAD model. Shown in FIG. 6 is a surface of a finite element model 650 and interpolation functions 651 that are generated to represent the CAD model that the finite element model 650 represents. In such an embodiment, the finite element model 650 and the interpolation function 651 and the projections between the surface of the finite element model and the interpolation functions, such as the projection 652, can be used to determine one or more errors between the finite element model and the CAD model. In such an embodiment, rather than taking projections between the finite element model and the CAD model itself, to be computationally more efficient, projections are taken between the finite element model 650 and the interpolation functions 651. The interpolation functions 651 may be generated according to principles as are known in the art. Further, in an embodiment of the present invention, the interpolation functions may approximate one or more variations between the first finite element model and the first CAD model. Further, as depicted in FIG. 6, the interpolation functions may be a field of bi-cubic interpolation functions that represent a surface geometry. In an embodiment of the present invention, the interpolation functions 651 may provide a closer approximation of the initial CAD geometry than interpolation functions associated with the finite element representation. According to an alternative embodiment of the present invention, the interpolation functions 651 may be utilized to modify the regular finite element representation of the original position fields to obtain an enhanced initial position field that more closely approximates the geometry of a respective CAD model.

In an embodiment of the present invention, high-order interpolation functions for initial geometry corrections may be built during batch preprocessing. FIG. 6 shows two finite-element-based surface facets, which each use bilinear spatial interpolation. A higher-order (bi-cubic in this case) interpolation field for a surface-geometry correction function is represented by the blue arcs in FIG. 6. This higher-order interpolation field for the geometry corrections can be constructed during batch preprocessing, such as during step 101c of the process 101, based on sampling the difference between the CAD surface geometry and the finite element based surface geometry at discrete points of the finite element surface facets (such as represented by the yellow arrows in the FIG. 6, one of which is the arrow 652). This implementation option may have more optimal performance characteristics in some cases.

FIG. 7 is a simplified block diagram of a computer based system 760 which may be used to perform a finite element simulation according to the principles of the present invention. The system 760 comprises a bus 765. The bus 765 serves as an interconnect between the various components of the system 760. Connected to the bus 765 is an input-output device interface 768 for connecting various input and output devices such as a keyboard, mouse, display, speakers, etc., to the system 760. Central processing unit (CPU) 762 is connected to the bus 765 and provides for the execution of computer instructions. Memory 767 provides volatile storage for data used for carrying out computer instructions. Storage 766 provides non-volatile storage for software instruction such as an operating system (not shown). The system 760 also comprises a network interface 761 for connecting to a variety of networks including WANs and LANs. Further connected to the bus 765 is a model module 763. The model module 763 may be configured to obtain a first finite element model and a first CAD model that the first finite element model represents. Communicatively coupled to the model module 763 is a simulation module 764. The simulation module 764 is configured to perform a finite element simulation using at least the first finite element model and the first CAD model.

The system 760 and its various modules may be configured to carry out any embodiments of the present invention as described herein. According to an embodiment of the invention, the system 760 obtains a first finite element model and a first CAD model that the first finite element model represents. The system 760 may obtain the first finite element model and first CAD model via the model module 763. Further, the simulation module 764 is configured to perform a finite element simulation using at least a first finite element model and the first CAD model obtained by the model module 763.

In an alternative embodiment of the system 760, the system 760 comprises a reporting module configured to report the solution of the finite element simulation. In such an embodiment, the reporting module may be configured to report any of the results or intermediate results determined when performing a finite element simulation or any calculation performed by the system 760. Alternatively, the system 760 may report any result via the network interface 761 and/or the input-output device interface 768.

According to another embodiment of the system 760, the modules as described herein may be software modules that may be executed by a processor, such as the CPU 762. According to an embodiment of the system 760, the simulation module 764 may be configured to perform the finite element simulation by utilizing the first CAD model to determine one or more variations between the first finite element model and the first CAD model. In yet another alternative embodiment of the system 760, the model module 763 is configured to obtain a second CAD model and a second finite element model. Further, in such embodiment, the simulation module 764 may be configured to perform the finite element simulation using the second finite element model and the second CAD model to perform the finite element simulation. In such an embodiment, the simulation module may be configured to perform the finite element simulation by utilizing the first CAD model and the second CAD model to determine one or more errors in the finite element simulation. In such an embodiment, the one or more errors in the finite element simulation may be a gap or penetration.

In yet another embodiment the system 760, the model module 763 is configured to obtain a second CAD model and the simulation module 764 is configured to perform a finite element simulation of contact between the first finite element model and the second CAD model and the simulation module 764 is further configured to perform the finite element simulation using the second CAD model. In an embodiment of the system 760 wherein a second CAD model is obtained, the simulation module 764 may be configured to treat the second CAD model as a rigid body when performing the finite element simulation of contact between the first finite element model and the second CAD model.

In yet another embodiment of the system 760, the simulation module 764 is configured to generate one or more interpolation functions based upon the first CAD model and perform the finite element simulation using the generated interpolation functions. According to an embodiment of the system 760, the first finite element model represents at least two parts and the finite element simulation simulates contact between the at least two parts.

FIG. 8 illustrates a computer network environment 870 in which the present invention may be implemented. In the computer network environment 870, the server 871 is linked through communications network 872 to clients 873*a-n*. The environment 870 may be used to allow the clients 873*a-n*, alone or in combination with the server 870, to execute the methods described herein.

It should be understood that the example embodiments described above may be implemented in many different ways. In some instances, the various methods and machines described herein may each be implemented by a physical, virtual, or hybrid general purpose computer, or a computer network environment such as the computer environment 870.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It also should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented method of designing a real-world physical object in a computer-aided design (CAD) system, the method comprising:
   obtaining in memory of a processor of a computer-aided engineering (CAE) system, a first finite element model and a first CAD model that the first finite element model represents, the CAD model representing at least one or more curved surface of a real-world physical object;
   by the processor, performing a finite element simulation of contact involving the real-world physical object by using both the first finite element model and the first CAD model within the simulation, said performing the finite element simulation including the CAE system determining contact behavior of the one or more curved surface of the real-world physical object, determining one or more variations between the first finite element model and the first CAD model, and using these determined variations in determining the contact behavior of the one or more curved surface of the real-world physical object to correct one or more errors in the contact behavior determined; and
   modifying the first CAD model in the CAD system based on a result of performing the finite element simulation in the CAE system such that the modified first CAD model more accurately represents real-world contact behavior of the physical object.

2. The method of claim 1 wherein the one or more variations between the first finite element model and the first CAD model includes a distance between a facet of the first finite element model and a surface of the first CAD model.

3. The method of claim 1 wherein the real-world physical object is a first real-world physical object and the method further comprises:
   obtaining a second finite element model and a second CAD model that the second finite element model represents, the second CAD model representing a second real-world physical object; and
   wherein performing the finite element simulation comprises simulating contact between the first real-world physical object and the second real-world physical object and the finite element simulation is performed using the second finite element model and the second CAD model.

4. The method of claim 3 wherein performing the finite element simulation comprises:
   utilizing at least one of the first CAD model and the second CAD model to determine the one or more errors.

5. The method of claim 4 wherein the one or more errors is an error in the simulated contact between the first real-world physical object and the second real-world physical object being at least one of:
   a gap; and
   a penetration.

6. The method of claim 1 further comprising:
   obtaining a second CAD model; and
   wherein performing the finite element simulation comprises simulating contact between the real-world physical object and the second CAD model and the finite element simulation is performed using the second CAD model.

7. The method of claim 6 wherein the second CAD model is treated as a rigid body in the finite element simulation.

8. The method of claim 1 wherein performing the finite element simulation comprises:

generating one or more interpolation functions based upon the first CAD model, the one or more interpolation functions approximating geometry of the first CAD model; and utilizing the interpolation functions to perform the finite element simulation.

9. The method of claim 1 wherein:

the first finite element model represents at least two parts; and the finite element simulation simulates contact between the at least two parts.

10. A computer-aided design (CAD) system for designing a real-world physical object, the CAD system comprising:

a processor and a memory with computer code instructions stored thereon, the processor and the memory, with the computer code instructions, being configured to cause the CAD system to:

obtain in memory of a computer-aided engineering (CAE) system, a first finite element model and a first CAD model that the first finite element model represents, the CAD model representing at least one or more curved surface of a real-world physical object;

perform a finite element simulation of contact involving the real-world physical object by using both the first finite element model and the first CAD model within the simulation, said performing the finite element simulation including the CAE system determining contact behavior of the one or more curved surface of the real-world physical object, determining one or more variations between the first finite element model and the first CAD model, and using these determined variations in determining the contact behavior of the one or more curved surface of the real-world physical object to correct one or more errors in the contact behavior determined; and modify the first CAD model in the CAD system based on a result of performing the finite element simulation in the CAE system such that the modified first CAD model more accurately represents real-world contact behavior of the physical object.

11. The CAD system of claim 10 wherein the one or more variations between the first finite element model and the first CAD model includes a distance between a facet of the first finite element model and a surface of the first CAD model.

12. The CAD system of claim 10 where the real-world physical object is a first real-world physical object and wherein the processor and the memory, with the computer code instructions, are further configured to cause the CAD system to:

obtain, in the memory of the CAE system, a second finite element model and a second CAD model that the second finite element model represents, the second CAD model representing a second real-world physical object; and in performing the finite element simulation, simulate contact between the first real-world physical object and the second real-world physical object using the second finite element model and the second CAD model to perform the finite element simulation.

13. The CAD system of claim 12 wherein the processor and the memory, with the computer code instructions, are further configured to cause the CAD system to perform the finite element simulation utilizing at least one of the first CAD model and the second CAD model to determine the one or more errors.

14. The CAD system of claim 13 wherein the one or more errors is an error in the simulated contact between the first real-world physical object and the second real-world physical object being at least one of:

a gap; and a penetration.

15. The CAD system of claim 10 wherein the processor and the memory, with the computer code instructions, are further configured to cause the CAD system to:

obtain a second CAD model in the memory of the CAE system;

simulate contact between the real-world physical object and the second CAD model; and perform the finite element simulation using the second CAD model.

16. The CAD system of claim 15 where, in performing the finite element simulation, the processor and the memory, with the computer code instructions, are further configured to cause the CAD system to treat the second CAD model as a rigid body in the finite element simulation.

17. The CAD system of claim 10 wherein the processor and the memory, with the computer code instructions, are further configured to cause the CAD system to:

generate one or more interpolation functions based upon the first CAD model, the one or more interpolation functions approximating geometry of the first CAD model; and perform the finite element simulation using the generated interpolation functions.

18. The CAD system of claim 10 wherein:

the first finite element model represents at least two parts; and the finite element simulation simulates contact between the at least two parts.

19. A computer program product executed by a server in communication across a network with one or more clients, the computer program product comprising:

a non-transitory computer readable medium, the computer readable medium comprising program instructions which, when executed by a processor causes:

obtaining in memory of a computer-aided engineering (CAE) system, a first finite element model and a first computer-aided design (CAD) model that the first finite element model represents, the CAD model representing at least one or more curved surface of a real-world physical object;

performing a finite element simulation of contact involving the real-world physical object by using both the first finite element model and the first CAD model within the simulation, said performing the finite element simulation including the CAE system determining contact behavior of the one or more curved surface of the real-world physical object, determining one or more variations between the first finite element model and the first CAD model, and using these determined variations in determining the contact behavior of the one or more curved surface of the real-world physical object to correct one or more errors in the contact behavior determined; and modifying the first CAD model in a CAD system using a result of performing the finite element simulation in the CAE system such that the modified first CAD model more accurately represents real-world contact behavior of the physical object.

20. The computer program product of claim 19 wherein the one or more variations between the first finite element model and the first CAD model includes a distance between a facet of the first finite element model and a surface of the first CAD model.

* * * * *